US006818818B2

(12) United States Patent
Bareis

(10) Patent No.: US 6,818,818 B2
(45) Date of Patent: Nov. 16, 2004

(54) CONCENTRATING SOLAR ENERGY RECEIVER

(75) Inventor: Bernard F. Bareis, 724 Sunkist La., Plano, TX (US) 75025

(73) Assignees: Esmond T. Goei, Dublin, CA (US); Bernard F. Bareis, Plano, TX (US)

( * ) Notice: Subject to any disclaimer, the term of this patent is extended or adjusted under 35 U.S.C. 154(b) by 0 days.

(21) Appl. No.: 10/217,861

(22) Filed: Aug. 13, 2002

(65) Prior Publication Data

US 2004/0031517 A1 Feb. 19, 2004

(51) Int. Cl.[7] .............................. H01L 31/052; F24J 2/12
(52) U.S. Cl. ..................... 136/246; 136/259; 136/261; 136/262; 136/252; 257/432; 257/433; 126/685; 126/684; 126/690; 126/695; 126/689; 126/688; 126/704; 60/641.8; 60/517; 60/641.15
(58) Field of Search ........................ 136/246, 259, 136/261, 262, 252; 257/432, 433; 126/685, 864, 690, 695, 689, 688, 704; 60/641.8, 517, 641.15

(56) References Cited

U.S. PATENT DOCUMENTS

| | | | | |
|---|---|---|---|---|
| 4,146,408 A | * | 3/1979 | Nelson | ........................ 136/259 |
| 4,153,474 A | * | 5/1979 | Rex | ............................ 136/246 |
| 4,388,481 A | * | 6/1983 | Uroshevich | .................. 136/246 |
| 4,943,325 A | * | 7/1990 | Levy | ........................... 136/259 |
| 6,020,553 A | * | 2/2000 | Yogev | ........................ 136/246 |
| 6,225,551 B1 | * | 5/2001 | Lewandowski et al. | ..... 136/246 |

FOREIGN PATENT DOCUMENTS

| | | | |
|---|---|---|---|
| DE | 3130226 A1 | * | 2/1983 |
| JP | 11-31835 A | * | 2/1999 |

* cited by examiner

*Primary Examiner*—Alan Diamond
(74) *Attorney, Agent, or Firm*—Howison & Arnott, L.L.P.

(57) ABSTRACT

There is disclosed herein a concentrating solar energy receiver comprising a primary parabolic reflector having a center and a high reflectivity surface on a concave side of the reflector and having a focal axis extending from the concave side of the reflector and passing through a focal point of the primary parabolic reflector; and a conversion module having a reception surface wherein the reception surface is spaced from the focal point by a predetermined distance and disposed to receive a predetermined cross section of radiant solar energy reflected from the concave side of the primary parabolic reflector for conversion to electrical energy in the conversion module. In one aspect, the conversion module includes a reception surface comprising a planar array of at least one photovoltaic solar cell. In another aspect, the conversion module includes a reception surface coupled to a thermal cycle engine. The mechanical output of the thermal cycle engine drives an electric generator.

65 Claims, 6 Drawing Sheets

CONCENTRATING SOLAR ENERGY RECEIVER

TECHNICAL FIELD OF THE INVENTION

This invention relates generally to the field of solar energy conversion and more particularly to a concentrating solar energy receiver.

BACKGROUND OF THE INVENTION

Devices for solar energy collection and conversion can be classified into concentrating types and non-concentrating types. Non-concentrating types intercept parallel unconcentrated rays of the sun with an array of detection or receiving devices such as a solar panel of photovoltaic cells or hot water pipes, for example. The output is a direct function of the area of the array. A concentrating type of solar energy collector focuses the energy rays using, e.g., a parabolic reflector or a lens assembly to concentrate the rays, creating a more intense beam of energy. The beam is concentrated to improve the efficiency of conversion of solar radiation to electricity or to increase the amount of heat energy collected from the solar radiation to provide for heating of water and so forth. In a conventional concentrating solar energy receiver, the incident solar radiation is typically focused at a point from a circular reflector (e.g., a dish-shaped reflector) or along a focal line from a cylindrical shaped reflector. In another prior art example, such as disclosed in U.S. Pat. No. 5,882,434 issued to William E. Horne, a flat portion in the center of a round, parabolic primary reflector provided by flattening the center portion of the reflector radially to a predetermined diameter before the parabolic curve commences outward to the rim of the reflector. In this device the reflected solar energy is focused at a ring corresponding to the outer diameter of the flat central portion of the reflector.

However, even conventional concentrating solar energy receivers require improvement for two reasons. First, the solar energy conversion module in conventional systems is located directly at the focal point or focal line which occupies a very small volume. This small volume causes a high concentration of heat that must be dissipated in the region of the focal point. Secondly, a large portion of the infrared portion of the radiant solar energy spectrum cannot be efficiently converted to electricity by currently available low mass conversion devices such as solar cells. Instead, this excess infrared energy is collected by the reflector and contributes to heating the conversion device which can impair the conversion efficiency of the solar cells.

SUMMARY OF THE INVENTION

There is disclosed herein a concentrating solar energy receiver comprising a primary parabolic reflector having a high reflectivity surface on a concave side of the reflector and having a focal axis extending from the concave side of the reflector which passes through a focal point of the primary parabolic reflector; and a conversion module having a reception surface wherein the reception surface is spaced from the focal point by a predetermined distance and disposed to receive a predetermined cross section of radiant solar energy reflected from the concave side of the primary parabolic reflector. The radiant energy thus collected may be converted to electrical energy in the conversion module. In one aspect, the conversion module includes a reception surface comprising a planar array of at least one photovoltaic solar cell. In another aspect, the conversion module includes a reception surface coupled to a thermal cycle engine. The mechanical output of the thermal cycle engine drives an electric generator.

In an alternate embodiment, there is disclosed a concentrating solar energy receiver comprising a primary parabolic reflector having high reflectivity surface on a concave side of the reflector and having a first focal axis extending from a concave side of the reflector which passes through a focal point of the primary parabolic reflector; a secondary parabolic reflector of smaller area than the primary parabolic reflector which has a second focal axis aligned along the first focal axis, and is disposed with a convex side having a high reflectivity surface facing the concave side of the primary parabolic reflector. The secondary parabolic reflector is spaced from the focal point of the primary parabolic reflector along the first focal axis by a predetermined distance, for reflecting the radiant solar energy reflected from the primary parabolic reflector, in substantially parallel rays, toward a central portion of the primary parabolic reflector. A conversion module, having a reception surface wherein the reception surface is positioned along the first focal axis within the central portion of the primary parabolic reflector is disposed to receive the radiant solar energy reflected from the secondary parabolic reflector. The radiant energy thus collected may be converted to electrical energy. In one aspect, the concentrating solar energy receiver is configured to selectively admit the radiant solar energy to the conversion module such that an admittance bandpass of the system to the radiant solar energy substantially matches a conversion bandpass of the conversion module. In another aspect, the conversion module includes a reception surface which comprises a planar array of at least one photovoltaic solar cell. In yet another aspect, the conversion module includes a reception surface coupled to a thermal cycle engine. The mechanical output of the thermal cycle engine drives an electric generator.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1A:
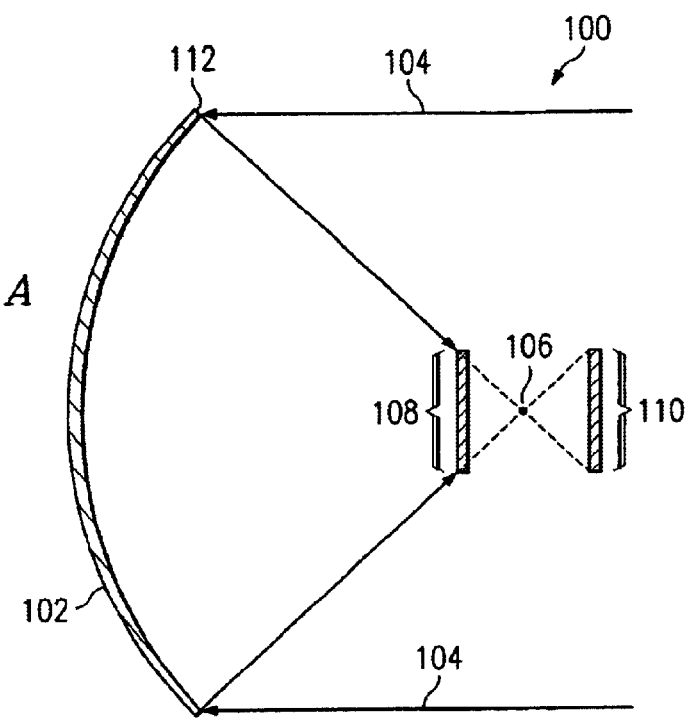
FIG. 1A illustrates one embodiment of a concentrating solar energy receiver in accordance with the present disclosure.

Referring now to FIG. 1A, there is illustrated one embodiment of a concentrating solar energy receiver according to the present disclosure. The concentrating solar energy receiver 100 includes a primary parabolic reflector 102 shown in cross section which intercepts solar energy radiation in the form of a plurality of incident rays 104 being reflected from a highly reflective concave side of the primary parabolic reflector 102 toward a focal point 106. It will be appreciated that the focal point 106 lies along the first or principle focal axis of the primary parabolic reflector 102 and passes through the center of the reflector 102 and substantially perpendicular to a plane tangent to the center of the reflector 102. This focal axis is not shown in the diagram for clarity, but will understood to be present as described unless otherwise stated. As is well known, incident rays 104 from the sun falling within the outer rim 112 of the primary parabolic reflector 102 will be reflected through the focal point 106. Also shown in FIG. 1A are a near focal area 108 and a far focal area 110. These focal areas, which each define a planar region disposed substantially at right angles to the principle focal axis passing through the focal point 106, are offset or displaced along the principle axis by a predetermined distance either toward the primary parabolic reflector 102 or away from the primary parabolic reflector 102. The area of a focal area is approximately the same, or slightly larger than, the cross-sectional area of the reflected radiation pattern at the location of the focal plane along the principle axis.

A focal area in this disclosure is defined as a planar region representing the desired position of a sensor for receiving solar energy for the purpose of converting it to another form. Such focal area regions may also be referred to herein as reception areas or reception surfaces. Reception or solar sensor surfaces are the energy-incident portions of a conversion device or module which receive the incident energy and transfer it to structures in the conversion device or module which convert the incident solar energy to an electrical, mechanical or thermal form. It will be readily appreciated by those skilled in the art that a solar energy sensor having a plane area approximately the size of focal area 108, or alternatively, focal area 110, is in a position to intercept all of the reflected incident rays being directed through the focal point 106. In addition, the reflected solar energy is uniformly distributed at a lower average intensity throughout that focal area. Thus, the solar energy sensor located at a focal area intercepts all of the radiation but intercepts the energy at a uniform, lower intensity which, in practical terms, means that the solar energy sensor is less subject to intensity peaks and can more readily dissipate heat energy that is outside the conversion bandpass of the conversion module. This is because the heat energy contained in the solar radiation is intercepted over a larger area than would exist at the more concentrated focal point. By distributing the received energy evenly over a larger surface, the useful operating life of the conversion module is increased significantly. Thus, a concentrating solar energy receiver configured as shown in FIG. 1A can be built in a wider variety of sizes with much less severe constraints placed upon the heat dissipation capability of the solar energy conversion module that is utilized in the concentrating solar energy receiver of the present disclosure. It will be apparent from the description which follows that some of the parameters which may be adjusted to provide various output levels are the size of the primary reflector, the size of the solar sensor, the position or offset of the solar sensor from the focal point, the way in which heat dissipation is provided, etc.

Continuing with FIG. 1A, the primary parabolic reflector 102 shown in FIG. 1A in cross section may in general be of circular shape, that is, the rim 112 when viewed looking toward the concave surface of the primary parabolic reflector 102 appears as a circle. As is well known, this is an efficient shape for receiving incident solar energy radiation. However, the concentrating solar energy receiver 100 of the present disclosure is not limited to a circular primary reflector 102 but could be other geometric shapes such as an ellipse, an oval, a rectangle (i.e., a cylindrical reflector), a polygon or an array of regular polygons or any other closed plane figure. Such an array of panel segments could be a composite of contiguous shapes placed edge-to edge or a composite of reflecting elements arranged in proximity to one another or a composite of reflecting elements arranged in predetermined positions though not necessarily close together. Further, the individual panel segments may have a flat or curved surface. The primary reflector may be constructed of any material in which the desired parabolic shape may be maintained. Some examples of suitable materials include metals, such as polished aluminum, steel with nickel or chromium plating; glass, with or without a silvered coating (as in a mirror); ceramics or other composites such as fiberglass, graphite, polymers or plastics having a reflective coating or plating; or any other material that meets the structural and reflective properties required of a parabolic reflector. In some applications a reflective sheet or membrane having sufficient support to maintain a parabolic shape may be used as a reflector. However, it will be appreciated by persons skilled in the art that a light weight metal such as aluminum offers a number of advantages such as high strength-to-weight ratio, ease of manufacture, ability to provide a polished, highly reflective finish and the ability to conduct heat away from any structure that is mounted thereon. Some of the various construction variations will be described in detail hereinbelow.

Continuing with FIG. 1A, the solar energy conversion module, which may be used with the primary parabolic reflector 102 and which has a planar solar energy sensor to be positioned within one or the other of the focal areas 108, 110, may be of several basic types. These may include, illustratively, an array of one or more photovoltaic solar cells or a thermal cycle engine coupled to an electric generator, for example. In this description an electric generator may refer to any device which converts solar or mechanical or thermal energy to direct or alternating current electricity. Further, an electric generator includes an alternator. The specific solar energy conversion module that may be used in the embodiment of FIG. 1A is not shown therein for clarity, the purpose of FIG. 1A being to illustrate the principle of positioning the solar sensor portion of the conversion module at a predetermined distance from the actual focal point of the primary parabolic reflector 102. As will become apparent hereinbelow, the choice of which focal area 108 or 110 is selected for a particular application will become clear as various embodiments of the concentrating solar energy receiver 100 are further described.

In a preferred embodiment of the concentrating solar energy receiver shown in FIG. 1A, a photovoltaic solar cell conversion module includes one or more triple junction solar cells, specifically triple junction $GaInP_2/GaAs/Ge$ solar cells. Such solar cells currently available are capable of operating with intensities of solar radiation of up to several hundred suns, where one sun equals 0.1368 watts per centimeter squared ($W/cm^2$). Solar cells suitable for use in the concentrating solar energy receiver of the present disclosure include devices manufactured by EMCORE Photovoltaics of Albuquerque, N. Mex. or Spectralab, Inc., a division of the Boeing Company located in Sylmar, Calif. The solar energy sensor for a conversion device will typically be made up of an array of solar cells of the type described in the foregoing, arranged in a planar array to be positioned in the plane of the focal area chosen. It is essential to ensure that the solar sensor be carefully positioned so that the sunlight reflected from the primary reflector is uniformly distributed throughout the focal area and is uniformly distributed upon the surface of the solar cell array. Failure to ensure a uniform distribution of reflected energy can result in damage to the conversion module.

Generally speaking, the focal area 108 is preferred for the location of the solar sensor of the conversion module. However, the focal area 110 is preferable when a thermal cycle engine is selected as the conversion device because that location enables the conversion device, that is the thermal cycle engine, to be fully enclosed within a housing having an aperture positioned to surround the focal point 106. This configuration, which is illustrated in FIG. 7B, permits the entry of all of the reflected incident rays into the housing surrounding the thermal cycle engine. This housing may be fully insulated and configured to contain any heat energy that might otherwise escape from the heat engine to the surroundings. Thus the amount of heat energy presented to the input of the thermal cycle engine may be maximized for optimum efficiency of the concentrating solar energy receiver that employs a thermal cycle engine. In applications where it is desired to utilize a thermal cycle engine, one suitable choice is a Stirling engine which, as is well known in the art, is a closed cycle regenerative heat engine which alternately stores energy in a working fluid. In another portion of the cycle the energy is released from the working fluid as the heat input to the thermal cycle engine is converted to mechanical motion—e.g., rotary or reciprocating—and used to drive a generator to produce electricity. Stirling engines may be readily built using construction information that is widely available and so will not be described further herein.

Figure 1B:
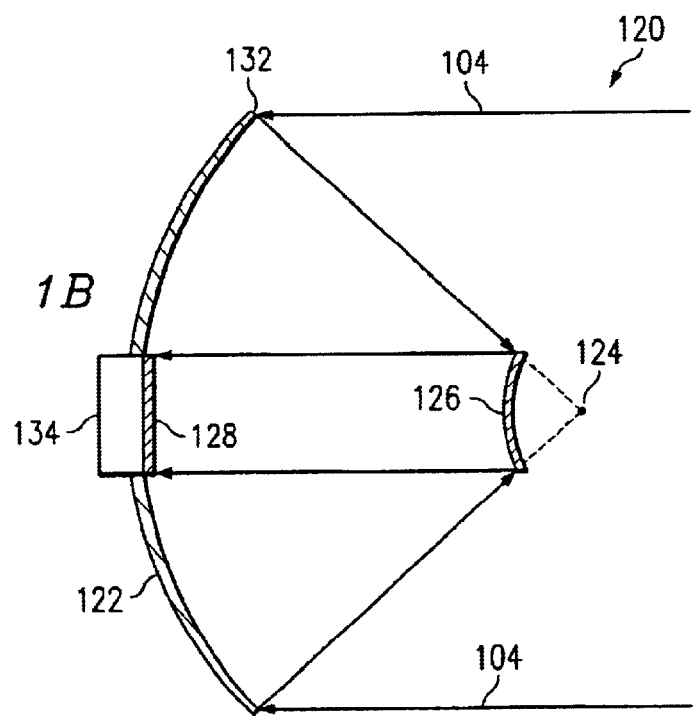
FIG. 1B illustrates an alternate embodiment of a concentrating solar energy receiver in accordance with the present disclosure having both a primary reflector and a secondary reflector.

Referring now to FIG. 1B, there is illustrated an alternate embodiment of a concentrating solar energy receiver 120 showing, in cross section, a primary parabolic reflector 122 which intercepts the incident rays of solar radiation 104 falling within the outer rim 132 and reflects them toward a focal point 124 which is located on a principle axis passing through the center of the primary parabolic reflector 122. In FIG. 1B, the principle axis passing through the center of the primary reflector 122 is not shown for clarity, it being understood where it is located. The characteristics of the primary parabolic reflector 122 are the same as described for the primary parabolic reflector 102 of FIG. 1A. A focal area is also defined for the embodiment shown in FIG. 1B. However, in the focal area 126 of FIG. 1B, there is positioned a secondary parabolic reflector 126, which has characteristics (except for size) generally to same as or similar to the primary parabolic reflector 122. The secondary parabolic reflector 126 may be constructed in the same way as the primary parabolic reflector 122. In this embodiment, the secondary parabolic reflector is disposed to intercept and reflect all incident rays 104 reflected from the primary parabolic reflector 122 from a convex surface of the secondary parabolic reflector 126 back toward the central portion of the primary parabolic reflector 122. As will be appreciated, the convex parabolic surface of the secondary parabolic reflector 126 enables the reflection of the rays incident thereon in a direction that is parallel to the original incoming incident rays 104 from the sun. Thus the rays reflected from the secondary parabolic reflector are substantially parallel and will illuminate the center portion of the primary parabolic reflector. This centrally-located focal area, now defined in the center of the primary parabolic reflector, may also be called a reception surface 128. The reception surface 128 is part of a conversion module 134. The secondary parabolic reflector 126 is offset by a predetermined distance from the focal point 124 toward the primary parabolic reflector 122. Again, to control the cross-sectional area of the incident solar radiation beam so as to correspond with the overall cross-sectional area of the solar sensor utilized in a conversion module, the reception area is sized and placed so that the solar sensor region is substantially in the plane of the primary parabolic reflector. This embodiment presents several advantages for maximizing the efficiency of a concentrating solar energy receiver according to the present disclosure as will be described more fully hereinbelow.

Continuing with FIG. 1B, the concentrating solar energy receiver 120 shown therein has three advantages over the embodiment illustrated in FIG. 1A. First, locating the focal area 128, or alternatively the reception surface 128, at the central portion of the primary parabolic reflector 122 permits the conversion module 134 to transfer excess heat produced by the incident radiation within the heat dissipating qualities of the material used for the primary parabolic reflector 122. Thus, for example, if the primary reflector is constructed of aluminum and the conversion module having a solar sensor in the plane of the central portion of the primary reflector 122, is placed in contact with the primary reflector 122 it may transfer the heat from the conversion module 134 to the metal shell forming the primary reflector 122.

Second, by locating the conversion module 134 at the center part of the primary reflector 122, the center of gravity of the entire concentrating solar energy receiver may be more closely positioned to the supporting structure of the primary parabolic reflector 122. Thus, the largest single unit of the concentrating solar energy receiver 120 in combination with the conversion module 134 permits smaller and more efficient structures for moving and positioning the assembly with respect to the direction of the sun, etc.

Third, the positioning of a secondary reflector at the focal area 126 not only facilitates the two advantages described above, but it also permits the use of a filter element (not shown in FIG. 1B) to be placed on or in front of the secondary parabolic reflector 126 for the purpose of filtering solar radiation components which lie outside the conversion bandpass of the solar sensor and conversion module 134 that is utilized for the concentrating solar energy receiver 120. For example, a filtering material can be laminated or attached to the secondary parabolic reflector 126 to permit only solar energy which is within the conversion bandpass of the solar sensor and conversion module 134, thus limiting the amount of unconvertible energy reaching the surface of the solar sensor portion of the conversion module 134 and reducing thereby the heat dissipation requirements of the conversion module 134 itself. To say it another way, the use of a filter in conjunction with the secondary parabolic reflector 126 controls the admittance bandpass of the concentrating solar energy receiver so that it corresponds substantially to the conversion bandpass of the solar energy conversion module 134 that is utilized with the concentrating solar energy receiver 120 of FIG. 1B.

Continuing further with FIG. 1B, the reflective properties of the secondary parabolic reflector 126 may be altered in a number of ways to provide the filtering effect described hereinabove. For example, a number of processes in manufacturing are suitable. These may include laminating or applying a chemical coating or covering or depositing a film of suitable material on the surface of the secondary parabolic reflector 126. The use of a specialized material positioned next to the surface of the secondary reflector itself may also be utilized to provide the required filtering. Other processes useable to achieve the desired reflective properties may include chemical plating or doping of the reflector surface material and the like. In one alternative embodiment a secondary parabolic reflector may be may of a glass or plastic material that is transparent to some wavelengths of solar radiation (which are not useful for conversion by present conversion devices) and reflective to other wavelengths which are useful for conversion of solar energy to electrical energy or to other useful forms. As an example, glass is a versatile material that may be coated to provide a variety of properties including reflection, absorption or filtering of specified wavelengths. The techniques and processes for achieving such properties are well known and will not be further described herein. Excess energy in the form of spectral solar radiation components that are not needed by the conversion device may be absorbed, passed-through or dissipated over the surface area of the secondary parabolic reflector 126 and radiated to the environment through a suitable heat sinking or conducted to a heat exchanger configured for the purpose. It will also be appreciated that a filter element may be used with, applied to or incorporated with the primary parabolic reflector, either to supplement the filtering associated with the secondary parabolic reflector or in the embodiment wherein a secondary parabolic reflector is not used. Such a primary parabolic reflector could be constructed as outlined previously in this paragraph. Details of the solar energy radiation spectrum and the bandpass aspects of various structures of the concentrating solar energy receiver of the present disclosure will be described further in conjunction with FIGS. 4, 5 and 6.

Figure 2A:
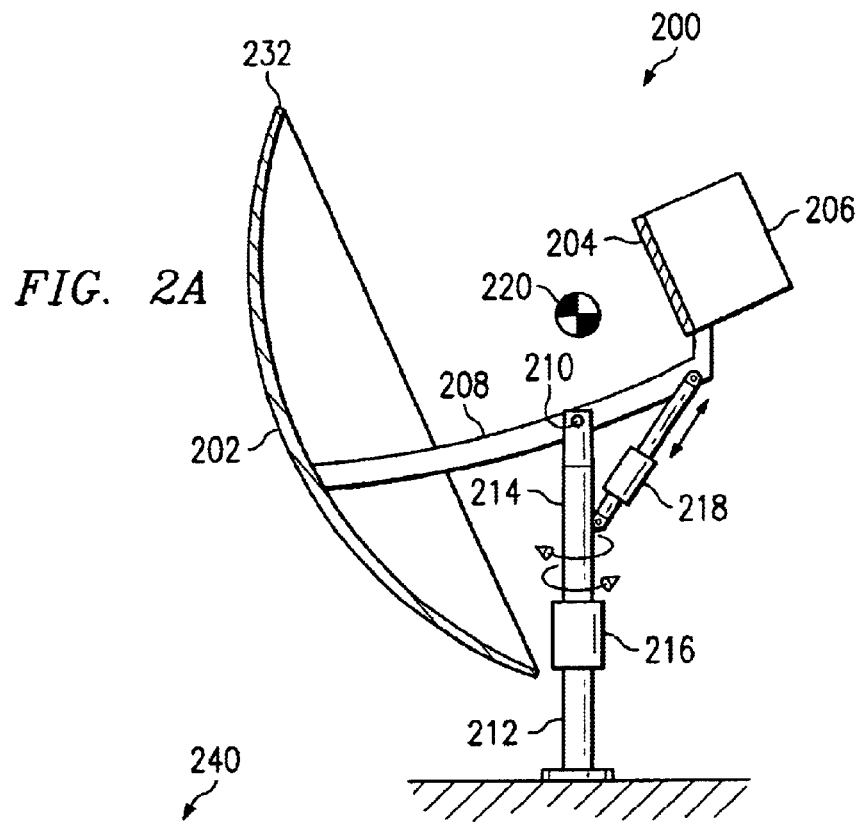
FIG. 2A is a pictorial drawing of the embodiment of FIG. 1A showing the supporting structure for the primary reflector and a corresponding solar-to-electrical energy conversion module.

Referring now to FIG. 2A, there is illustrated an embodiment of a concentrating solar energy receiver shown in pictorial form to illustrate a mounting structure for a concentrating solar energy receiver according to the present disclosure. The concentrating solar energy receiver 200 of FIG. 2A includes a primary parabolic reflector 202 shown in cross section and having a circular shape and a rim 232 which defines the circular outer perimeter of the primary parabolic reflector 202. Also shown in FIG. 2A is a focal area 204 (or reception surface 204) which represents the solar sensing surface of a conversion module 206. The primary parabolic reflector 202 is as previously described in conjunction with FIG. 1A. The focal area 204 is as previously described in FIG. 1A wherein the focal area 204 is offset with respect to the focal point of the primary parabolic reflector as the near focal area 108 appears in FIG. 1A. In FIG. 2A, the focal area 204 represents the solar sensing portion of a conversion module 206. The conversion module 206 may illustratively be a solar cell array as previously described hereinabove or it may also be a combination of a thermal cycle engine and an electric generator unit as also previously described.

Continuing with FIG. 2A, the primary parabolic reflector 202 and the conversion module 206, which includes the reception surface 204, are held in a fixed relationship by a first frame member 208. The first frame member 208 is connected to the primary parabolic reflector 202 near its center and extends therefrom to connect with and support the conversion module 206 along the principle axis of the primary parabolic reflector 202. The solar sensor in the reception surface 204 is thus positioned to directly face the center portion of the primary parabolic reflector 202 such that it receives all of the solar energy radiation being reflected from the primary parabolic reflector 202. The first frame member 208 is connected to a rotatable vertical post 214 at a pivoting joint 210 which permits the first frame member 208 to rock in a vertical plane about a horizontal axis so that the primary parabolic reflector 202 may be positioned at any required elevation angle while pivoting about the axis of the pivoting joint 210. The rocking motion of the first frame member 208 is provided by a vertical control actuator 218 which consists of a variable length strut whose length may be varied under the action of a motor or linear actuator in the longitudinal axis of the vertical control actuator 218. The rotating post 214 is rotatably secured to a horizontal control motor 216 which in turn is supported by a vertically oriented stationary base 212 anchored upon the ground, a building or other structure. The vertical control actuator 218 provides for adjusting the elevation of the concentrating solar energy receiver assembly 200 of the present disclosure. The horizontal control motor permits the adjustment of the azimuth of the concentrating solar energy conversion receiver 200 of the present disclosure. Thus the primary parabolic reflector 202 of a concentrating solar energy receiver 200 may be aimed directly at the sun and enabled to track the sun as it proceeds across the sky during daylight hours.

One property of the concentrating solar energy receiver 200 illustrated in FIG. 2A is that the center of gravity 220 of the movable portion of the system is located approximately between the primary parabolic reflector 202 and the conversion module 206 near the principle axis of the primary parabolic reflector 202 and approximately above the upward end of the rotating vertical post 214 coupled to the first frame supporting member 208. The embodiment of FIG. 2A would be suitable for use with the solar cell type of conversion module with the solar sensing portion positioned in the region of the near focal area as shown in the near focal area 108 of FIG. 1A. However, the embodiment of FIG. 2A may also be adapted to use with a thermal cycle engine type of conversion module by locating the solar sensing portion of the thermal cycle engine in the region of the far focal area 110 of FIG. 1A. In this position, the conversion module 206 that utilizes a thermal cycle engine can be enclosed in a housing having an aperture located surrounding the focal point (see, e.g., FIG. 7B), the housing being utilized to contain the heat energy within a near field of the solar energy portion of the thermal cycle engine to maximize the amount of heat applied to the input of the thermal cycle engine.

Continuing with FIG. 2A, while the embodiment illustrated therein applies one of the principles of the present disclosure, that is in utilizing an offset focal area, this embodiment is somewhat awkward mechanically. It is more expensive and less efficient to implement because of the attachment of the first frame member 208 to the concave side of the primary reflector 202 and because of the location of the center of gravity 220 away from the structures of the concentrating solar energy receiver 200 having the most mass. For example, in order for the primary reflector 202 to be aimed at the sun when the sun is directly overhead, a large cut-out region or slot must be cut into the primary reflector 202 to permit it to move past the base 212, vertical support 214 and control motor 216. Further, a greater amount of structural components are required to support the primary reflector 202 and the conversion module 206 in the correct relationship as shown in FIG. 2A. The cutout region in the primary reflector 202 creates additional complexity in the mechanical support to maintain the parabolic shape of the primary reflector 202 as well as reduces the available reflective surface area for use in receiving sunlight.

Figure 2B:
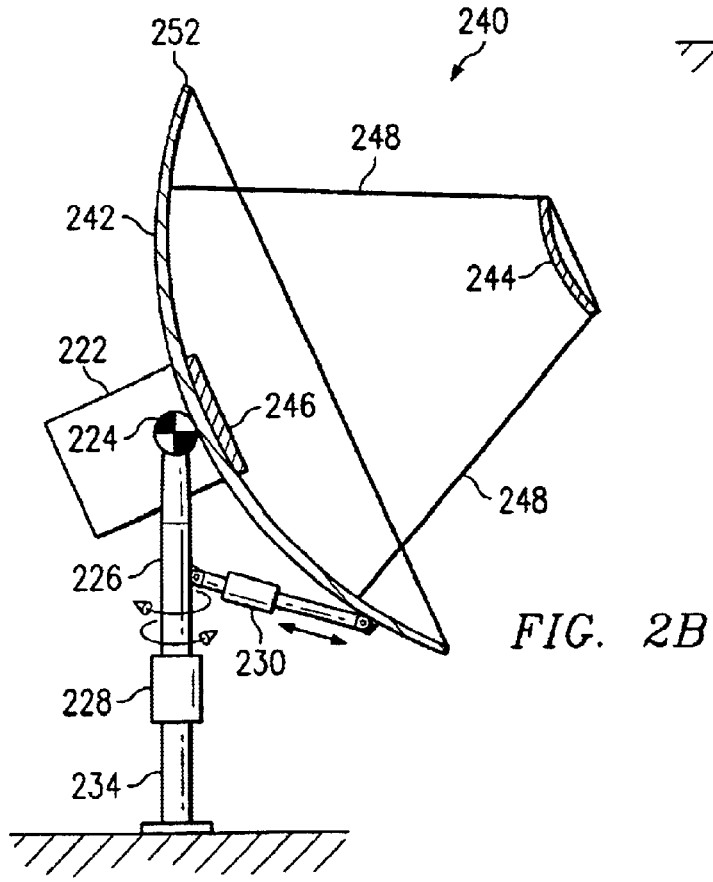
FIG. 2B is a pictorial drawing illustrating an alternate embodiment of FIG. 1B showing the supporting structure for the primary and secondary reflectors and a corresponding solar-to-electrical energy conversion module.

Referring now to FIG. 2B, there is illustrated an alternate and preferred embodiment of a concentrating solar energy receiver 240 according to the principles of the present disclosure. In this embodiment, the primary parabolic reflector 242, shown in cross section and having a circular rim 252 includes a secondary parabolic reflector 244 disposed along the principle focal axis of the primary reflector and at the near focal area for reflecting radiant energy toward a focal area 246 (or reception surface 246) on the surface of the center portion of the primary parabolic reflector 242. Also located in the center portion of the primary parabolic reflector 242 is the conversion module 222 which includes the solar sensing reception surface 246 mounted in the center portion of the primary parabolic reflector 242. The secondary parabolic reflector 244 is shown supported on struts 248 which may be attached to the rim 252 or, as shown in FIG. 2B, to the concave side of the primary parabolic reflector 242. It will be appreciated that the focal axis of the secondary reflector 244 lies along the focal axis of the primary reflector in the embodiment of FIG. 2B, that is, their principle axes are coincident.

With the distribution of masses of the various components of the concentrating solar energy receiver 240 as shown in FIG. 2B, the center of gravity is located approximately at the center of and just behind the primary parabolic reflector 242. This location of the center of gravity 224 considerably simplifies the supporting structure needed to support the concentrating solar energy receiver 240 and provide for its movement in both the elevation and azimuth directions. The concentrating solar energy receiver 240 is supported at the top of a rotating vertical post 226. Rotating vertical post 226 is controlled by a horizontal control motor 228 which is supported at the upper end of a vertically oriented stationary base 234. The stationary base 234 may be mounted upon the ground, a building or other structure. Also attached to the rotating vertical post 226 is a vertical control motor 230, which is a variable length strut controlled by a linear actuator or motor disposed along the longitudinal axis of the variable length strut and is provided to control the elevation of the concentrating solar energy receiver 240. The azimuth orientation of the concentrating solar energy receiver 240 is controlled by the horizontal control motor 228. It will be appreciated that in both FIGS. 2A and 2B, the respective control motors for the vertical (elevation) and horizontal (azimuth) may be controlled by suitable electronics which are not shown in the diagrams, but are readily available and known to persons skilled in the art.

Continuing with FIG. 2B, it is apparent that locating the most massive components together positions the center of gravity in such away that the responsiveness of the control system is maximized and the size of the actuating units and motors is minimized, thus increasing performance and reducing the cost of the assemblies required. Further, the use of the secondary parabolic reflector 244 more readily permits the use of filtering elements as described hereinabove so that the admittance bandpass of the reflecting portions of the concentrating solar energy receiver 240 is well matched to the conversion bandpass of the conversion module 222 utilized therein. This advantage is especially realized when the conversion module 222 employs a solar cell array of the triple junction solar cells previously described. Matching of the light reflecting filtering and absorption properties of the secondary reflector 244 can be accomplished using any of several processes in manufacturing including, but not limited to, chemical coating or plating or deposition of other materials on the surface of the secondary parabolic reflector 244, or use of specialized materials in the reflector construction, or the use of chemical doping of the reflective material, or lamination of filtering materials upon the reflective surface of the secondary parabolic reflector 244. Excess heat which is rejected by the filtering element or otherwise absorbed by the secondary parabolic reflector 244 may be dissipated over the surface area of the secondary parabolic reflector 244. Further, the secondary reflector may be mounted on a heat sink structure to improve the dissipation of heat therefrom. Alternatively a filtering element or function may be applied to the primary parabolic reflector 242 or to the reception surface 246, with excess heat energy dissipated through contact with adjacent structures in the primary parabolic reflector 242. In typical applications, filtering maybe applied to one or more of the three structures: the primary reflector 242, secondary reflector 244 and the reception surface 246. In an alternate embodiment the secondary parabolic reflector may be fabricated of glass or other similar transmissive material that reflects wavelengths to be applied to the solar energy reception surface and passes through those wavelengths which will not be received and utilized.

Figure 3:
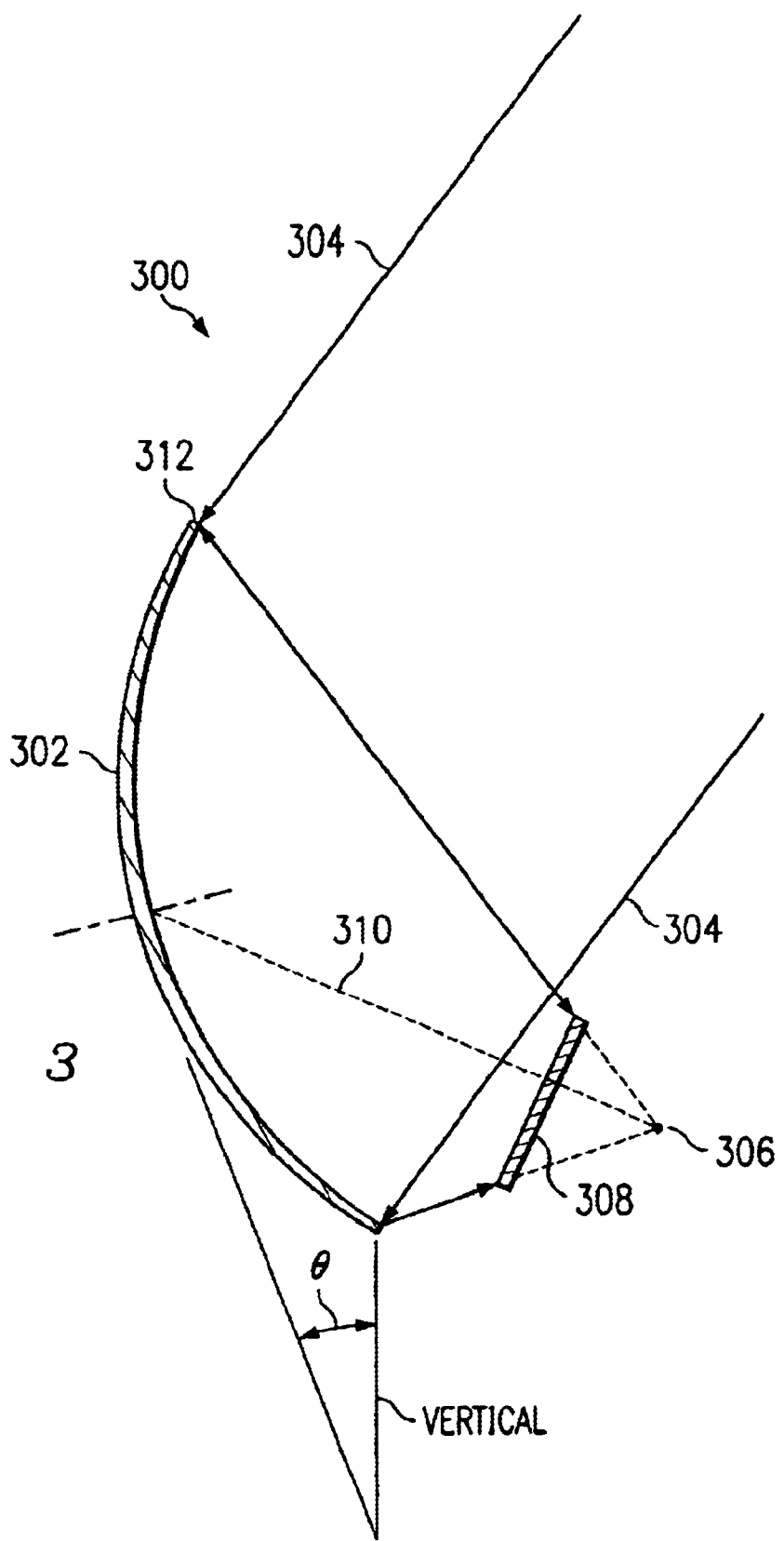
FIG. 3 illustrates another alternate embodiment of the concentrating solar energy receiver of FIG. 1A wherein the focal area is positioned away from the principle axis of the primary reflector.

Referring now to FIG. 3, there is illustrated an alternate embodiment of the concentrating solar energy receiver of the present disclosure. It will be recalled from the description of FIGS. 1A, 1B, 2A and 2B that the focal areas or solar sensors or solar cells or secondary reflectors have been located on the principle axis of the primary reflector. These embodiments are known as prime focus reflectors because of the location of the sensing or reflecting elements along the principle axis of the primary reflector. An alternate embodiment as shown in FIG. 3 offsets the focal point from the principle axis in order to maintain the primary reflector 302 at a steeper angle θ with respect to the earth's surface. This orientation prevents the accumulation of debris and other precipitants or particulates. It also allows moisture and contaminants to drain from the reflective surface while the primary reflector 302 is collecting incident solar radiation from relatively high elevation angles. The primary parabolic reflector 302 of FIG. 3 is also shown in cross section and in a shape having a rim 312. Solar radiation along incident rays 304 is reflected toward the focal point 306 located along an offset focal axis which also passes through the center of the primary parabolic reflector 302. As before, the focal area 308, which represents the potential position of the solar sensor portion of a conversion module or secondary reflector, may typically be oriented perpendicular to the focal axis 310, but may in some applications be oriented at angles other than perpendicular to the focal axis 310. However, in the embodiment shown in FIG. 3 the solar sensor is shown positioned at the near focal area 308 and approximately perpendicular to the focal axis 310. As thus positioned, the primary parabolic reflector 302 will tend not to accumulate atmospheric precipitation such as rain, snow or other contaminants (such as dust or other particulates) all of which may damage the reflector or tend to reduce the operating efficiency of the concentrating solar energy receiver of the present disclosure. The principle components of the concentrating solar energy receiver 300 as shown in FIG. 3 may be supported by similar structures as described previously in conjunction with FIGS. 2A and 2B.

Figure 4:
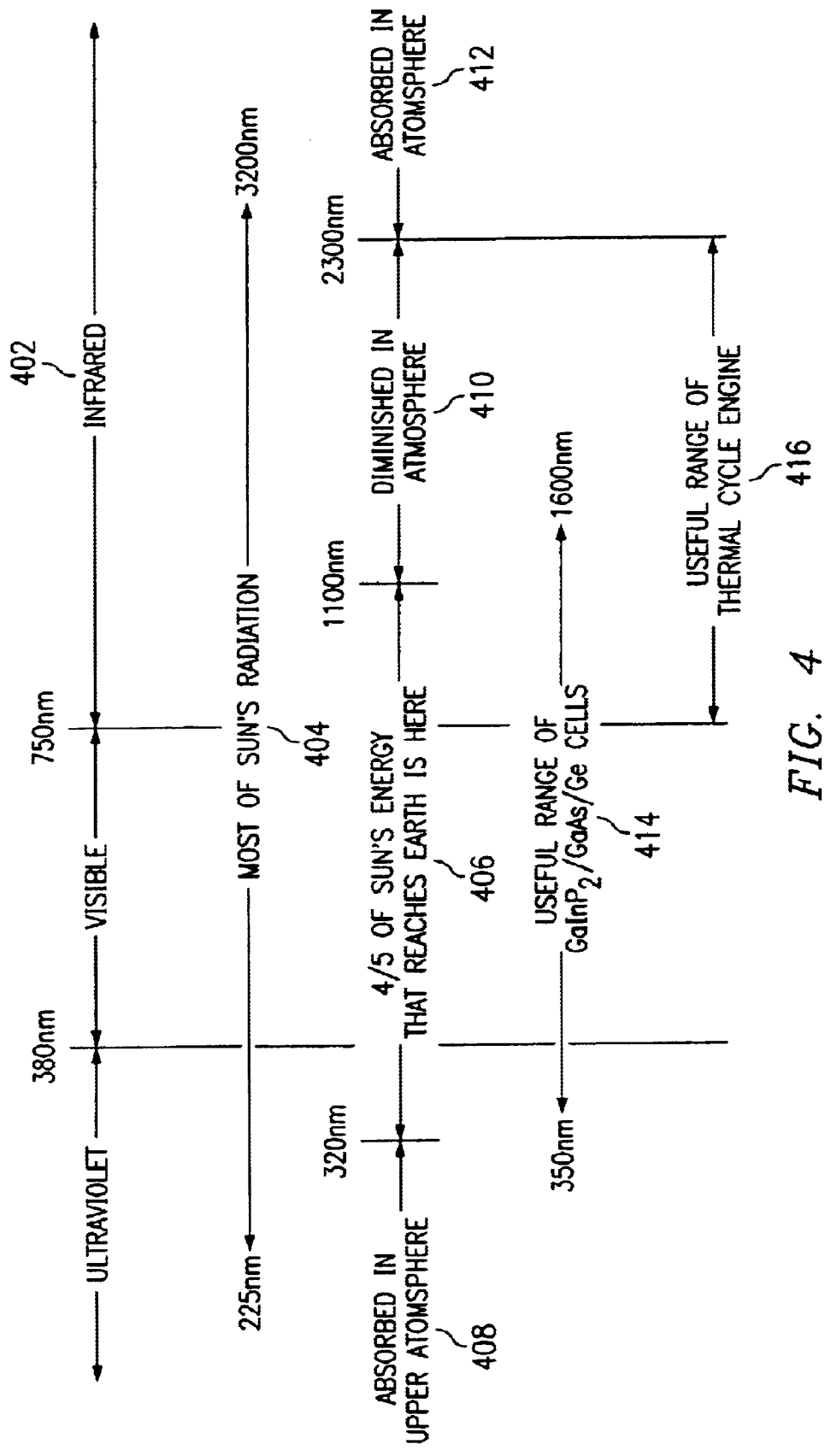
FIG. 4 is a graph illustrating the various components and wavelengths of the solar radiation spectrum as compared with the effects of the atmosphere thereon and the conversion bandpass of several currently available solar energy conversion devices.

Referring now to FIG. 4, there is shown a series of graphs representing the spectrum components of electromagnetic radiation along axis 402. These categories include wavelengths shorter than 380 nanometers, the ultraviolet spectrum, between 380 nanometers and 750 nanometers, the visible light spectrum, and for wavelengths longer than 750 nanometers, the infrared radiation spectrum. On another axis 404 is represented the range of solar radiation extending from 225 nanometers to 3200 nanometers which overlaps the three categories of electromagnetic radiation described above. On a third axis is represented the destination of the solar radiation as it travels from the sun toward the earth. The range of 320 nanometers to 1100 nanometers along axis 406, which straddles the visible light spectrum as well as a portion of the ultraviolet and infrared spectrums, includes approximately ⅘ of the sun's energy that reaches the earth Ultraviolet wavelengths shorter than 320 nanometers are absorbed in the upper atmosphere as represented on axis 408. For infrared wavelengths longer than 1100 nanometers, axis 410 shows that this energy is diminished or attenuated as it passes through the earth's atmosphere. The very long infrared wavelengths greater than 2300 nanometers in length are absorbed in the atmosphere as represented along axis 412 and do not reach the surface of the earth.

Continuing with FIG. 4, an axis 414 represents the useful range or conversion bandpass of the triple junction solar cells contemplated for application in several of the embodiments of the present disclosure. This conversion bandpass of the triple junction $GaInP_2/GaAs/Ge$ solar cells extends from 350 nanometers in the near ultraviolet spectrum through the visible light spectrum to the near infrared spectrum at approximately of 1600 nanometers. As can be seen from FIG. 4, this conversion bandpass covers essentially the entire range wherein ⅘ of sun's energy reaches the earth's surface. Thus a conversion module which uses a triple junction solar cell as described herein is able to capture approximately ⅘ of the radiation from the sun for conversion to electricity or other uses. Also shown in FIG. 4 is the approximate useful range of a typical thermal cycle engine which is shown along line 416 to extend from approximately 750 nanometers through the infrared spectrum range to at least 2300 nanometers. It will be appreciated that the solar energy reaching the surface of the earth lies between the wavelengths of 320 nanometers and 2300 nanometers and is greater than the range of wavelengths of conversion of the presently available triple junction cells employed in the preferred embodiments. It may also be appreciated that, wide as the conversion bandpass of presently available triple junction solar cells is, further advances in technology may extend this range beyond the present limits so that conversion of energy in the wavelengths shorter than approximately 350 nm and/or longer than approximately 1600 nm would permit useful conversion applications in locations at the earth's surface or above the earth's atmosphere such as in space stations, satellites and the like.

The energy of the spectrum which lies outside the range of the triple junction cells, that is, having wavelengths smaller than 350 nanometers or greater than 1600 nanometers, represents unuseable or excess energy. This excess energy may cause a decrease in the efficiency of the triple junction cells and thus represents energy that must be reduced, diverted or otherwise dissipated. As described previously hereinabove, one way to reduce this excess energy is to filter it. For example, a filter element may be used in conjunction with a secondary parabolic reflector. The filter element may be a coating applied to the surface of the reflector or it may be an integral property of the reflector as described hereinabove. Filtering may also be applied at the primary parabolic reflector or disposed as a separate element of the concentrating solar energy receiver disclosed herein.

Figure 5:
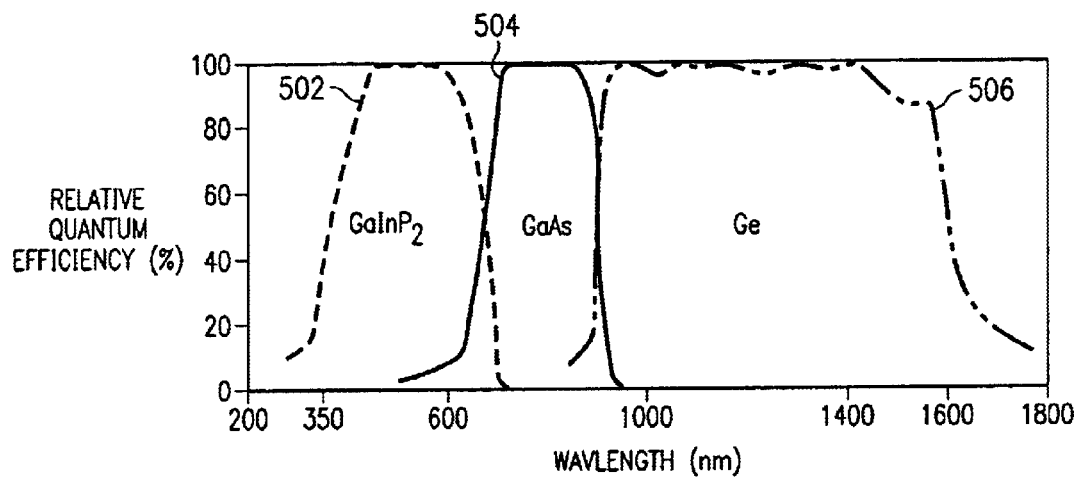
FIG. 5 is a graph showing the relative quantum efficiency vs. the active wavelength range of a triple junction $GaInP_2/GaAs/Ge$ solar cell.

Referring now to FIG. 5, there is illustrated a graph of the relative quantum efficiency in percent versus the wavelength in nanometers of the distinct semiconductor portions of the triple junction solar cell suggested for use in the preferred embodiments of the present disclosure. The three semiconductor materials include a compound of gallium, indium and phosphorous, designated as $GaInP_2$, gallium arsenide, designated by GaAs and the element germanium, Ge. The useful relative quantum efficiency range of the gallium indium phosphorous compound shown by the dashed line 502 extends approximately from 350 to 650 nanometers. The useful relative quantum efficiency range of the gallium arsenide semiconductor material extends from approximately 650 nanometers to approximately 900 nanometers as shown by the solid line 504. The useful relative quantum efficiency range of the germanium semiconductor material, as shown by the dotted line 506, extends from approximately 900 nanometers to approximately 1600 nanometers. Thus it can be seen that the approximate composite conversion bandwidth for the triple junction solar cell described in FIG. 5 extends from approximately 350 nanometers to 1600 nanometers which is in agreement with the illustration in FIG. 4.

Figure 6:
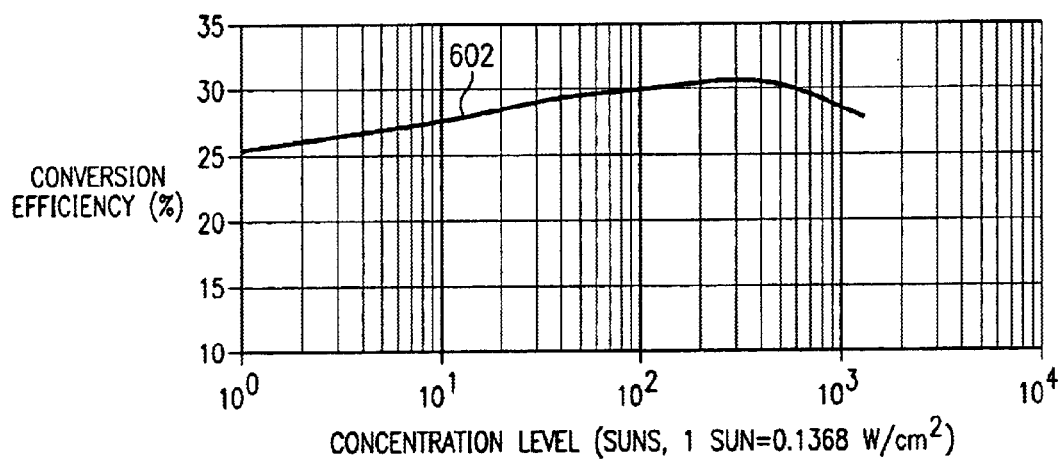
FIG. 6 is a graph showing the conversion efficiency performance vs. the solar energy radiation level for a triple junction solar cell as shown in FIG. 5.

Referring now to FIG. 6, there is illustrated a graph of the overall conversion efficiency of the triple junction solar cells described hereinabove in percent versus the concentration level of the solar radiation in units of suns, wherein one sun equals 0.1368 watts per centimeter squared ($W/cm^2$). This level corresponds to the intensity of the direct solar energy radiation at the earth's surface of approximately 1 $kW/m^2$. It can be seen from the solid line 602 in the graph of FIG. 6 that the conversion efficiency of the triple junction solar cells covers a broad range of solar energy concentration level exceeding 25% from a concentration level of one sun to greater than 1000 suns with the peak occurring between approximately 100 and 600 suns.

Figure 7A:
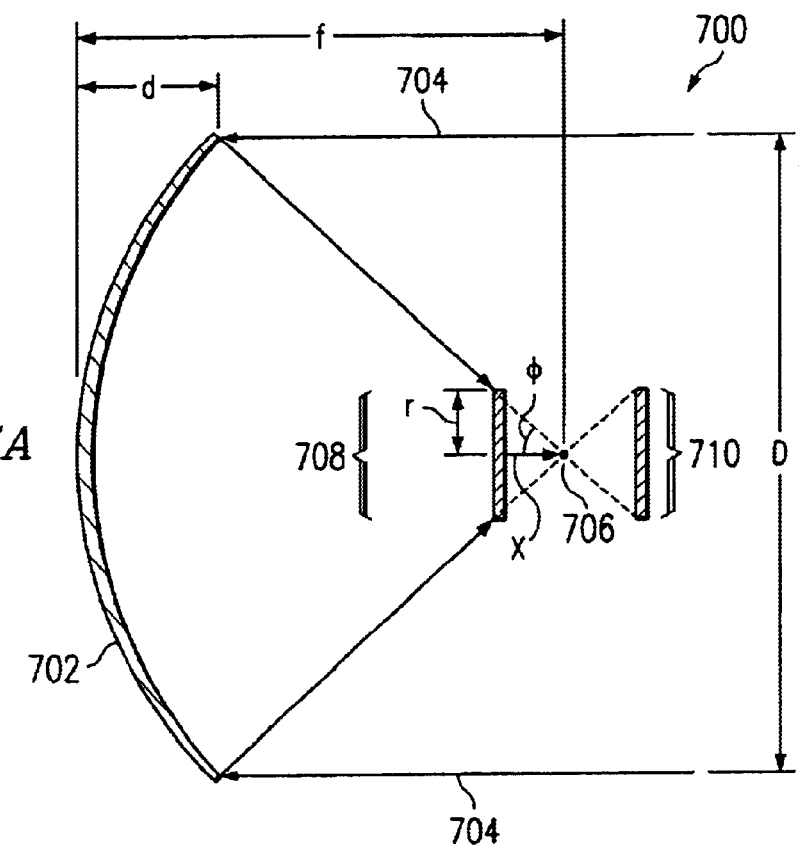
FIG. 7A illustrates a design example for a concentrating solar energy receiver according to the present disclosure.
Figure 7B:
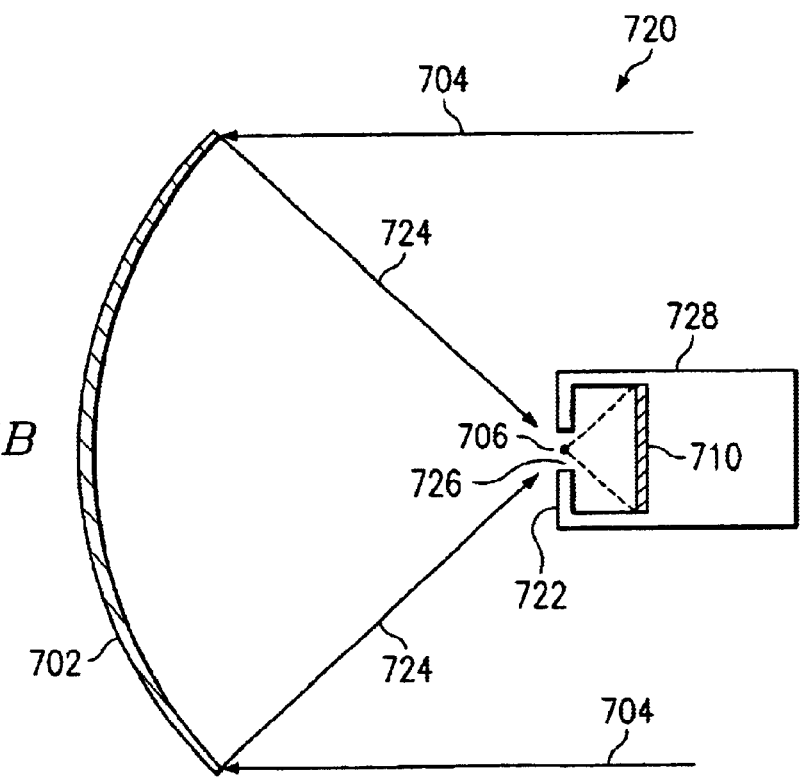
FIG. 7B illustrates an alternate embodiment of the embodiment of FIG. 2A using a thermal cycle engine in a solar-to-electrical energy conversion module.

Referring now to FIG. 7A, there is illustrated a cross sectional view of a concentrating solar energy receiver 702 similar to that illustrated in FIG. 1A. Some of the calculations for designing a typical concentrating solar energy receiver of the present disclosure will now be described. A primary parabolic reflector 702 is shown in cross section which reflects incident rays 704 to focal point 706. These reflected rays may pass through either near focal area 708 or far focal area 710. Also shown in FIG. 7A are symbols representing various dimensions which will be used in the calculations. The symbol D represents the aperture or diameter of the primary parabolic reflector. The symbol d represents the depth of a primary parabolic reflector. The symbol f represents the distance from the primary parabolic reflector center to the focal point along a principle axis. A symbol r represents of the radius of the circular focal area. It will be appreciated that, as this embodiment is shown in cross-section, both the primary parabolic reflector and the focal area will be circular shapes as previously described hereinabove. The symbol x represents the distance from the focal point to the focal area in either direction along the principle axis. The variables r and x are related by the equation:

$$x = r/\tan\phi \qquad (1)$$

Further, the "shallowness" of a parabolic reflector is given by the ratio f/D. In practice, this ratio would need to be between approximately 0.25 and 1.0 in order to preserve the ease of manufacturing. Moreover, as a practical matter, it is much easier to fabricate, finish, and transport shallow (that is, low f/D ratio) prime focus parabolic reflectors. The radius r is determined from the amount of surface area of the reception area part of the conversion module i.e., the diameter of the solar cell array, that is required to provide the desired electrical output.

To determine the approximate primary parabolic reflector diameter, it is noted that solar insolation, that is the power of the incoming sunlight per unit area, reaching the surface of the earth is approximately 1 kilowatt per square meter (1 kW/m$^2$) or 100 miliwatts per square centimeter (100 mW/cm$^2$). The efficiency of the solar to electrical conversion element is also a primary determining factor in the diameter of the reflector required. In this example, the efficiency is taken from FIG. 6 as will be described. The diameter of the primary parabolic reflector can be calculated from the following relationship:

$$D = 2\sqrt{((P/I)/E + S)/\pi} \qquad (2)$$

where:

P is the electrical power output required in kilowatts; I is the approximate value for solar insolation, that is approximately 1 kW/m$^2$; S is the area of the shadow cast by the conversion module;

D is the diameter of the primary parabolic reflector; and E is the conversion efficiency of the conversion module.

In the next step it will be determined what focal area is required for triple junction solar cells used as a conversion module. The focal area and its radius r can be determined by noting the technical specification for triple junction solar cells. For example, from the manufacturer's data, maximum efficient output can be obtained with an intensity range of 200 to 500 suns and operating the cells with a safety margin at 450 suns would produce an output of approximately 14 W/cm$^2$ of area of the solar cell array. Then, to generate an electrical output of 1.36 kilowatts for example, dividing 1,360 watts by 14 W/cm$^2$ yields a result of 97 square centimeters. Thus, 97 cells, each having an area of 1 cm$^2$ would be required and would take up an area of approximately 97 square centimeters. Because the cells are square and must be fit into a roughly circular area, the overall focal area required for illumination of the cell array will be slightly larger or approximately 100 square centimeters (11.28 cm diameter). This arises from the fact that in practice, geometric incongruities caused by fitting a plurality of square, triple junction cells into an array forming a circular area will require a circle having an area slightly larger than 97 square centimeters.

We have previously observed from FIG. 6 that the typical conversion efficiency of a triple junction solar cell array in the presence of 400 to 500 suns of insolation is slightly above 30%. Moreover, the shadow that the conversion module will cast will be approximately 100 cm$^2$. Plugging these values into equation (2), the diameter of the primary parabolic reflector will then be: D=2.4 meters. To determine where to position the focal area for a shallowness ratio, f/D of 0.75, we multiply the f/D ratio of 0.75 times 2.4 meters and find that the focal point is 1.8 meters from the center of the primary reflector along the principle axis. At this location it can be determined that the angle θ in FIG. 7 is 45°. Then, it can be determined from equation 1 that the value x, the distance of the focal area from the focal point, is 5.64 centimeters. Thus, in this design example, a triple junction solar cell in a circular array having an area of 100 square centimeters for use with a primary parabolic reflector having an overall diameter of 2.4 meters is located approximately 5.64 centimeters toward the primary reflector from the focal point. In the alternative embodiment, using a conversion module located at the center of the primary parabolic reflector, this is also the correct position of a secondary parabolic reflector having a diameter of approximately 11.28 centimeters.

Referring now to FIG. 7B, there is illustrated a cross-sectional diagram of a concentrating solar energy receiver 720 according to the present disclosure that is a variation of the embodiment illustrated in FIG. 1A wherein the conversion module to be used employs a solar sensor panel in the location of the far focal area. A primary parabolic reflector is shown at 702 for receiving solar radiation along incident ray 704 which is reflected along the path indicated by 724 through the focal point 706 and further along the dashed lines to a solar sensor panel 710 located at the position of focal area 726 which is also known from the description hereinabove as the far focal area. Coupled with the solar sensor 710 is a thermal cycle engine enclosed within a housing 728. The housing includes extensions 722 which extend beyond the reception surface of the solar sensor 710 and enclose the space between the solar sensor 710 and the plane containing the focal point which is at right angles to the principle axis of the primary reflector 702. The housing extension includes an aperture 706 which is just large enough for the reflected rays from the parabolic reflector 702 to pass through the aperture into the space within the housing in front of the solar sensor 710. It will be observed that the heat energy contained in the radiation that enters the housing area will tend to be contained therein and contribute to the incidence of solar energy into the input heat exchanger of the thermal cycle engine within the housing 728. As was mentioned hereinabove, the thermal cycle engine includes a mechanical coupling from the output of the thermal cycle engine to an electric generator.

Other features may be incorporated in the specific implementation of the concentrating solar energy receiver of the present disclosure. For example, the primary reflector, or some other portion of the structure may include one or more lightning rod or arresting devices to prevent lightning damage to the receiver. The reflectors and the reception surfaces may include a protective coating to retard oxidation or deterioration of the reflective surfaces or solar sensing surfaces. The reflectors may be protected from moisture precipitation, particulates, debris or other contaminants by a covering or from hail and other objects by a screen that may be fixed or movable. Accessory panels or deflectors may be utilized to minimize the disturbance of the receiver components by wind. In other examples, solar energy may be collected in a concentrating solar energy receiver of the present disclosure for application to other uses or conversion to other forms. One advantageous implementation may collect heat energy for heating water or other liquids, gases or plasmas. Heat transferred to such materials may be readily transported to other locations or structures. As solar sensing and energy storage technologies develop, selective portions of the solar radiation spectrum may be collected and converted, processed or stored for a variety of applications. For example, the ultraviolet wavelengths, those wavelengths shorter than 380 nanometers may be received, collected and applied to industrial or scientific processes. Or, variations of the basic principles of the present disclosure may be adapted to reception of solar radiation at locations above the earth's atmosphere where wavelengths above and below the visible spectrum of solar radiation are unaffected by absorption or other attenuation of their intensities.

Although the preferred embodiment has been described in detail, it should be understood that various changes, substitutions and alterations can be made therein without departing from the spirit and scope of the invention as defined by the appended claims.

What is claimed is:

1. A concentrating solar energy receiver, comprising:
   a primary parabolic reflector having a principal axis and a center and a high reflectivity surface on a concave side of said reflector and having a focal axis extending from said center of said concave side of said reflector and passing through a focal point of said primary parabolic reflector, said high reflectivity surface having a restricted reflectivity over frequency such that light at wavelengths less than a minimum wavelength and greater than a maximum wavelength is attenuated to reflect light over a selected portion of the solar energy spectrum; and
   a conversion module having a reception surface wherein said reception surface is spaced from said focal point by a distance and disposed to receive a cross-section of radiant solar energy at the restricted reflectivity reflected from said concave side of said primary parabolic reflector such that said conversion module is only subjected to such restricted reflectivity said frequency.

2. The receiver of claim 1, wherein said primary parabolic reflector comprises a reflective parabolic configuration of a material selected from the group consisting of a metal, a polymer, a fiberglass composite, a glass, a ceramic and any composite or combination of these.

3. The receiver of claim 2, wherein said primary parabolic reflector comprises an outline, when viewed from said principle axis, selected from the group consisting of circular, oval, elliptical, rectangular and any regular polygon or other closed plane figure.

4. The receiver of claim 3 wherein said selected portion of said spectrum comprises wavelengths in the range of 380 nanometers to 750 nanometers.

5. The receiver of claim 3, wherein said selected portion of said spectrum comprises wavelengths in the range of 350 nanometers to 1600 nanometers.

6. The receiver of claim 1, wherein said primary parabolic reflector comprises means for dissipating radiant energy which is not reflected by said primary parabolic reflector, and which is attenuated.

7. The receiver of claim 1, further comprising a frame for supporting said primary parabolic reflector with respect to the earth and for supporting said primary parabolic reflector and said conversion module together in an assembly having a relationship.

8. The receiver of claim 7, wherein said frame comprises:
   a base mounted in a fixed relationship with the earth;
   a first member for supporting said primary parabolic reflector and said conversion module in said relationship;
   a second member attached to said assembly and operable for providing azimuthal orientation of said assembly; and
   a third member attached to said second member and to said assembly and operable for providing elevation orientation of said assembly.

9. The receiver of claim 8, wherein said frame further comprises:
   a motor drive assembly in each said second and third member for providing said orientation; and
   a control system for controlling each said motor drive assembly.

10. The receiver of claim 1, wherein said conversion module comprises:
    means for converting solar energy to electric energy; and
    a solar energy sensor coupled with said means for converting;
    wherein said solar energy sensor includes said reception surface and said reception surface is configured as a plane surface for receiving incident solar energy thereupon.

11. The receiver of claim 1, wherein said conversion module having a reception surface comprises a planar array of a plurality of photovoltaic solar cells wherein each cell is disposed such that its solar energy incident surface forms part of said reception surface.

12. The receiver of claim 11, wherein each of said photovoltaic solar cells comprises a semiconductor device.

13. The receiver of claim 12, wherein said semiconductor device comprises a triple junction solar cell formed of germanium, gallium-arsenide and gallium-indium-phosphorus semiconductor materials.

14. The receiver of claim 11, wherein said photovoltaic solar cells provide a conversion bandpass throughout the range of 350 nanometers to 1600 nanometers.

15. The receiver of claim 1, wherein said conversion module having a reception surface comprises a thermal cycle engine having a thermal input coupled to said reception surface and a mechanical output coupled to an electric generator.

16. The receiver of claim 15, wherein said thermal cycle engine is a Stirling engine.

17. The receiver of claim 1, further configured to selectively admit said radiant solar energy to said conversion module such that an admittance bandpass of said receiver to said radiant solar energy approximately matches a conversion bandpass of said conversion module.

18. The receiver of claim 17, wherein said admittance bandpass of said receiver is provided by said primary parabolic reflector further comprising a filter for allowing reflection of wavelengths within said conversion bandpass of said conversion module and impeding reflection of wavelengths outside said conversion bandpass.

19. The receiver of claim 18, wherein said filter comprises a covering applied to said high reflectivity surface of said primary parabolic reflector for impeding said reflection of wavelengths outside said conversion bandpass.

20. The receiver of claim 19, wherein said covering is provided by a process selected from the group consisting of laminating a filter material to said reflector, chemically doping a finish of said reflector, adding a filter element to said reflector and applying a coating material to said reflector.

21. The receiver of claim 18, wherein said filter comprises a sheet of filtering material supported between said high reflectivity surface of said primary parabolic reflector and said reception surface of said conversion module.

22. The receiver of claim 17, wherein said primary parabolic reflector is configured such that said high reflectivity surface allows reflection of wavelengths within said conversion bandpass and impedes reflection of wavelengths outside said conversion bandpass.

23. The receiver of claim 1, wherein said solar energy is converted to electrical energy in said conversion module.

24. The receiver of claim 1, wherein said solar energy is converted to thermal energy in said conversion module.

25. The receiver of claim 1, wherein said focal axis is the principle axis of said primary parabolic reflector, said principle axis extending from said center of said primary parabolic reflector and approximately perpendicular to a plane tangent to said center of said primary parabolic reflector.

26. The receiver of claim 1, wherein said focal axis extending from said center of said primary parabolic reflector is offset from the principle axis at an angle other than perpendicular to a plane tangent to said center of said primary parabolic reflector.

27. A concentrating solar energy receiver, comprising:
a primary parabolic reflector having a principle axis and a center and a high reflectivity surface on a concave side of said reflector and having a first focal axis extending from said center of said concave side of said reflector and passing through a focal point of said primary parabolic reflector;
a secondary parabolic reflector having a second focal axis aligned along said first focal axis, and disposed with a convex side having a high reflectivity surface facing said concave side of said primary parabolic reflector and spaced from said focal point along said first focal axis by a distance, for reflecting radiant solar energy reflected from said primary parabolic reflector, in parallel rays toward a central portion of said primary parabolic reflector;
said high reflectivity of at least one of said primary and secondary parabolic reflectors has a restricted reflectivity over frequency such that light at wavelength less than a minimum wavelength and greater than a maximum wavelength is attenuated to reflect light over a selected portion of the solar energy spectrum; and
a conversion module having a reception surface wherein said reception surface is positioned along said first focal axis within said central portion of said primary parabolic reflector and disposed to receive said radiant solar energy reflected from said secondary parabolic reflector.

28. The receiver of claim 27, wherein said primary parabolic reflector comprises a reflective parabolic configuration of a material selected from the group consisting of a metal, a polymer, a fiberglass composite, a glass, a ceramic and any composite or combination of these.

29. The receiver of claim 28, wherein said primary parabolic reflector comprises an outline, when viewed from said principle axis, selected from the group consisting of circular, oval, elliptical, rectangular and any regular polygon or other closed plane figure.

30. The receiver of claim 25 wherein said selected portion of said spectrum comprises wavelengths in the range of 380 nanometers to 750 nanometers.

31. The receiver of claim 25, wherein said selected portion of said spectrum comprises wavelengths in the range of 350 nanometers to 1600 nanometers.

32. The receiver of claim 27, wherein said primary parabolic reflector comprises means for dissipating radiant energy which is not reflected by said primary parabolic reflector and attenuated thereby.

33. The receiver of claim 27, wherein said primary parabolic reflector further comprises a frame for supporting said primary parabolic reflector with respect to the earth and for supporting said primary parabolic reflector and said conversion module together in an assembly having a relationship.

34. The receiver of claim 33, wherein said frame comprises:
a base mounted in a fixed relationship with the earth;
a first member for supporting said primary parabolic reflector and said conversion module in said relationship;
a second member attached to said assembly and operable for providing azimuthal orientation of said assembly; and
a third member attached to said second member and to said assembly and operable for providing elevation orientation of said assembly.

35. The receiver of claim 34, wherein said frame further comprises:
a motor drive assembly in each said second and third member for providing said orientation; and
a control system for controlling each said motor drive assembly.

36. The receiver of claim 27, wherein said secondary parabolic reflector comprises a reflective parabolic configuration of a material selected from the group consisting of a metal, a polymer, a fiberglass composite, a glass, a ceramic and any composite or combination of these.

37. The receiver of claim 36, wherein said secondary parabolic reflector comprises an outline, when viewed from said second focal axis, selected from the group consisting of circular, oval, elliptical, rectangular and any regular polygon or other closed plane figure.

38. The receiver of claim 27, wherein said high reflectivity surface of said secondary parabolic reflector reflects approximately all wavelengths of solar energy radiation incident thereupon.

39. The receiver of claim 27, wherein said high reflectivity surface of said secondary parabolic reflector reflects said selected portion of said spectrum.

40. The receiver of claim 39 wherein said selected portion of said spectrum comprises wavelengths in the range of 380 nanometers to 750 nanometers.

41. The receiver of claim 39, wherein said selected portion of said spectrum comprises wavelengths in the range of 350 nanometers to 1600 nanometers.

42. The receiver of claim 27, wherein said secondary parabolic reflector comprises means for dissipating radiant energy which is not reflected by or passed through said secondary parabolic reflector and attenuated thereby.

43. The receiver of claim 27, wherein said secondary parabolic reflector further comprises a frame for supporting said secondary parabolic reflector with respect to said primary reflector.

44. The receiver of claim 27, wherein said secondary reflector has an overall area smaller than an area of said primary reflector.

45. The receiver of claim 44, wherein said area of said secondary reflector is approximately equal to an area of said reception surface.

46. The receiver of claim 27, wherein said conversion module comprises:
means for converting solar energy to electric energy; and
a solar energy sensor coupled with said means for converting;
wherein said solar energy sensor includes said reception surface and said reception surface is configured as a plane surface for receiving incident solar energy thereupon.

47. The receiver of claim 27, wherein said conversion module having a reception surface comprises a planar array of a plurality of photovoltaic solar cells wherein each cell is disposed such that its solar energy incident surface forms part of said reception surface.

48. The receiver of claim 47, wherein each of said photovoltaic solar cells comprises a semiconductor device.

49. The receiver of claim 48, wherein said semiconductor device comprises a triple junction solar cell formed of germanium, gallium-arsenide and gallium-indium-phosphorus semiconductor materials.

50. The receiver of claim 47, wherein said photovoltaic solar cell provides a conversion bandpass throughout the range of 350 nanometers to 1600 nanometers.

51. The receiver of claim 27, wherein said conversion module having a reception surface comprises a thermal cycle engine having a thermal input coupled to said reception surface and a mechanical output coupled to an electric generator.

52. The receiver of claim 51, wherein said thermal cycle engine is a Stirling engine.

53. The receiver of claim 27, further configured to selectively admit said radiant solar energy to said conversion module such that an admittance bandpass of said receiver to said radiant solar energy approximately matches a conversion bandpass of said conversion module.

54. The receiver of claim 53, wherein said admittance bandpass of said receiver is provided by said primary parabolic reflector further comprising a filter for allowing reflection of wavelengths within said conversion bandpass of said conversion module and impeding reflection of wavelengths outside said conversion bandpass.

55. The receiver of claim 54, wherein said filter comprises a covering applied to said high reflectivity surface of said primary parabolic reflector for impeding said reflection of wavelengths outside said conversion bandpass.

56. The receiver of claim 54, wherein said filter is provided by a process selected from the group consisting of laminating a filter material to said reflector, chemically doping a finish of said reflector, adding a filter element to said reflector and applying a coating material to said reflector.

57. The receiver of claim 54, wherein said filter comprises a sheet of filtering material supported between said high reflectivity surface of said primary parabolic reflector and said reception surface of said conversion module.

58. The receiver of claim 53, wherein said primary parabolic reflector is configured such that said high reflectivity surface allows reflection of wavelengths within said conversion bandpass and impedes reflection of wavelengths outside said conversion bandpass.

59. The receiver of claim 53, wherein said admittance bandpass of said receiver is provided by said secondary parabolic reflector further comprising a filter for allowing reflection of wavelengths within said conversion bandpass of said conversion module and impeding reflection of wavelengths outside said conversion bandpass.

60. The receiver of claim 59, wherein said filter comprises a covering applied to said high reflectivity surface of said secondary parabolic reflector for impeding said reflection of wavelengths outside said conversion bandpass.

61. The receiver of claim 59, wherein said filter is provided by a process selected from the group consisting of laminating a filter material to said reflector, chemically doping a finish of said reflector, adding a filter element to said reflector and applying a coating material to said reflector.

62. The receiver of claim 59, wherein said filter comprises a sheet of filtering material supported between said high reflectivity surface of said secondary parabolic reflector and said reception surface of said conversion module.

63. The receiver of claim 53, wherein said secondary parabolic reflector is configured such that said high reflectivity surface allows reflection of wavelengths within said conversion bandpass and impedes reflection of wavelengths outside said conversion bandpass.

64. The receiver of claim 27, wherein said solar energy is converted to electrical energy in said conversion module.

65. The receiver of claim 27, wherein said solar energy is converted to thermal energy in said conversion module.

* * * * *

UNITED STATES PATENT AND TRADEMARK OFFICE
CERTIFICATE OF CORRECTION

PATENT NO. : 6,818,818 B2
DATED : November 16, 2004
INVENTOR(S) : Bernard F. Bareis and Esmond T. Goei It is certified that error appears in the above-identified patent and that said Letters Patent is hereby corrected as shown below:

Column 15,
Line 31, please insert the word -- over -- before the word "said".

Signed and Sealed this

First Day of February, 2005

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 6,818,818 B2 | Page 1 of 1 |
| APPLICATION NO. | : 10/217861 | |
| DATED | : November 16, 2004 | |
| INVENTOR(S) | : Bernard F. Bareis | |

It is certified that error appears in the above-identified patent and that said Letters Patent is hereby corrected as shown below:

Col. 13, line 1, replace "Φ" with --θ--

Signed and Sealed this
Eighth Day of May, 2012

David J. Kappos
*Director of the United States Patent and Trademark Office*